US006238951B1

(12) United States Patent
Caillat

(10) Patent No.: US 6,238,951 B1
(45) Date of Patent: May 29, 2001

(54) PROCESS FOR PRODUCING A SEALING AND MECHANICAL STRENGTH RING BETWEEN A SUBSTRATE AND A CHIP HYBRIDIZED BY BUMPS ON THE SUBSTRATE

(75) Inventor: Patrice Caillat, Echirolles (FR)

(73) Assignee: Commissariat a l'Energie Atomique (FR)

( * ) Notice: Subject to any disclaimer, the term of this patent is extended or adjusted under 35 U.S.C. 154(b) by 0 days.

(21) Appl. No.: 09/298,696

(22) Filed: Apr. 23, 1999

Related U.S. Application Data

(63) Continuation-in-part of application No. 08/553,495, filed as application No. PCT/FR94/00620 on Mar. 4, 1996, now abandoned.

(30) Foreign Application Priority Data

May 28, 1993 (FR) .................................................. 93 06417

(51) Int. Cl.[7] ............................ H01L 21/44; B23K 31/02
(52) U.S. Cl. ........................ 438/108; 438/615; 438/613; 228/180.22
(58) Field of Search ..................................... 438/613, 615, 438/FOR 343, 108; 228/180.22

(56) References Cited

U.S. PATENT DOCUMENTS 5,492,863 * 2/1996 Higgins .
6,051,450 * 4/2000 Ohsawa et al. .

OTHER PUBLICATIONS

"Flip Chip Encapsulating Resin", International Interconnection Intelligence Flip Chip Technology Impact Report, Chapter 5–205, 206 Date Unavailable.

"Microelectronics Packaging Handbook" Tummala et al date unknown; pp. 366–391.

* cited by examiner

Primary Examiner—David E. Graybill
(74) Attorney, Agent, or Firm—Hayes, Soloway, Hennessey, Grossman & Hage, PC

(57) ABSTRACT

Process for the production of a sealing and mechanical strength ring between a substrate and a chip hybridized by bumps on the substrate. The invention provides a process for producing an encapsulating ring (13) ensuring the sealing and mechanical strength of a chip (1) hybridized by bumps on a substrate (5). More particularly, contemporaneously with the production of the hybridization bumps (9) on the lower face (1a) of the chip or the substrate by a first meltable material, a sealing and mechanical strength ring is formed by depositing on the substrate or lower face of the electronic component a ring (13) of a second meltable material. The lower face of the chip then is placed on the substrate so as to produce the connections between said chip and said substrate by means of the first meltable material, and the thus formed assembly is heated to a temperature at least equal to the highest melting point of the first and second meltable materials, in order simultaneously to produce the hybridization bumps of the first material and the sealing ring of the second material. The ring is sized to have a height (h) and a width (d) in accordance with the following equation:

$$d > \frac{10^{-2} D \times h}{h - \alpha}$$

in which α is a shape coefficient factor and D is the largest dimension of the electronic component.

9 Claims, 2 Drawing Sheets

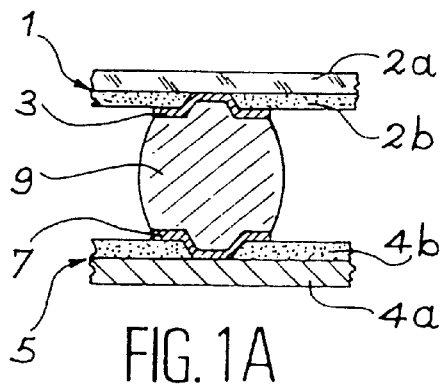
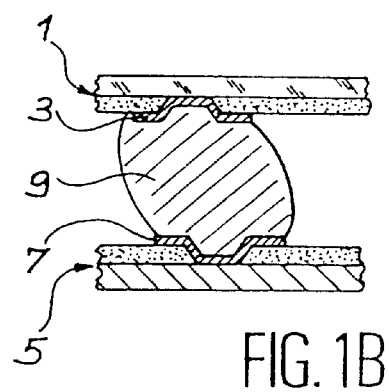
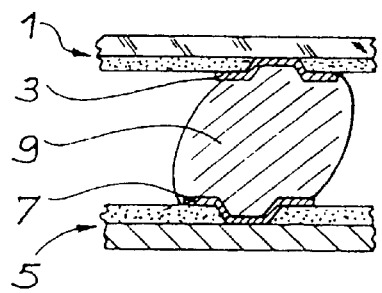
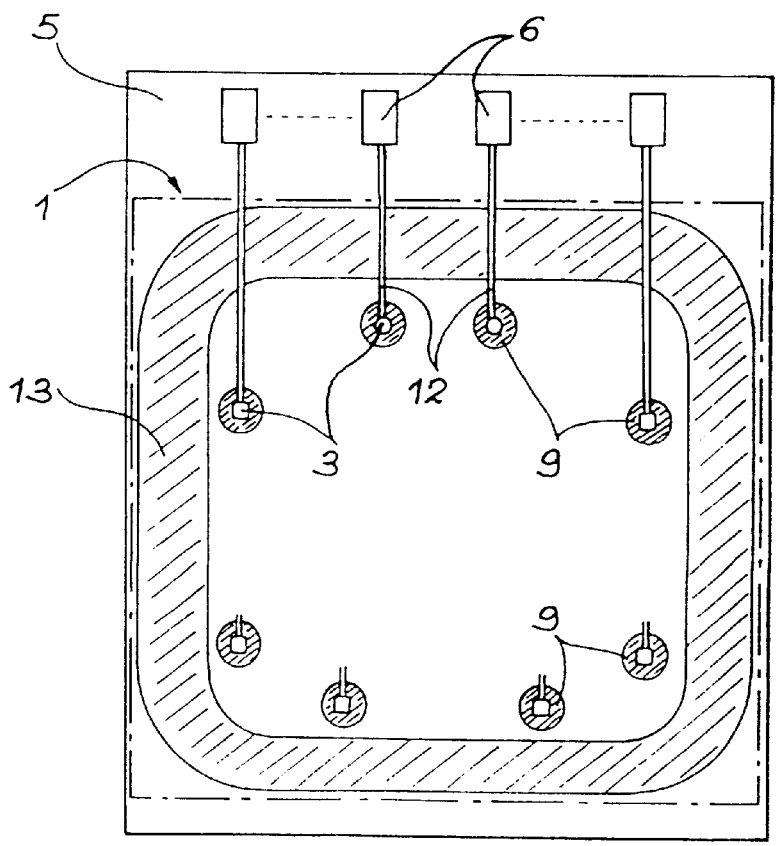

PROCESS FOR PRODUCING A SEALING AND MECHANICAL STRENGTH RING BETWEEN A SUBSTRATE AND A CHIP HYBRIDIZED BY BUMPS ON THE SUBSTRATE

This application is a continuation-in-part of copending application No. 08/ 553,495 filed on Nov. 28, 1995 International Application PCT/FR94/00620 filed on May 26, 1994 and which designated the U.S. and based on French application no. 93,06317 filed May 28, 1993.

TECHNICAL FIELD

The present invention relates to a process for producing a ring ensuring the mechanical strength and sealing between a substrate and a chip (or any other electronic component) hybridized by bumps on the substrate, which can itself integrate active or passive components. It has applications in the fields of microelectronics, information processing or on-board electronics.

PRIOR ART

A method for the transfer of electronic components to an interconnection substrate making use of microbosses or bumps forms part of the prior art and is known as flip-chip. According to the flip-chip method, the bumps are produced around input/output connections of the electronic component, e.g. of a deposited meltable material, by electrolysis or evaporation. This meltable material can, e.g. be indium or a tin-lead alloy. The transfer of component to the substrate takes place at a heating temperature at least corresponding to the melting point of the chosen meltable material. This transfer operation can be likened to soldering or brazing.

Such a process is known as C4 (control collapse chip connection) and forms the subject matter of numerous publications, e.g. the work entitled "Micro-electronics packaging handbook" published by R. TUMMALA.

However, the ever more frequent use of multichips implies an optimization of the surface of the useful substrate. It is for this reason that the flip-chip method is generally used in the case of multichips. It is in particular used in broad distribution sectors, where costs are the vital factor.

There has also been a technical development of substrates leading to flip-chip interconnection needs with respect to supports other than conventional silicon supports. These supports can e.g. be of alumina and can also be printed circuits.

However, the known flip-chip transfer method is reliable when the thermal expansion coefficients of the chip (or other electronic component) and the substrate are very close. However, alumina and to an even more pronounced extent the printed circuits commonly used as substrates, have an expansion coefficient differing very considerably from that of the chip normally produced on silicon. Moreover, when these expansion coefficients of the chip and the substrate differ, the changes (time variations) of temperature lead to significant stresses occurring in the bumps, which has the effect of embrittling them and significantly reducing the reliability of the system produced by the chip hybridized on the substrate.

FIGS. 1A, 1B and 1C are front views of different cases of hybridization bumps connecting a chip and a substrate. FIG. 1A shows the case of a bump in a medium raised to a mean temperature of approximately 20° C. In FIG. 1A, it is possible to see the chip 1 which a layer 2a of electrically conductive material, which is in contact with the connection point or connector 3. An electrically insulating layer 2b covers the lower face of the layer 2a around the connector 3. FIG. 1A also shows the substrate having an electrically conductive material layer 4a in contact with the connector 7. An electrically insulating layer 4b covers the layer 4a around the connector 7. The hybridization bump 9 ensures an electrical connection between the connector 3 of the chip 1 and the connector 7 of the substrate 5. For an ambient temperature of approximately 20° C., the bump has a vertical position and the connectors 3 and 7 are positioned substantially facing one another.

FIG. 1B shows the same hybridization bump when the ambient temperature is approximately −50° C. The difference in the thermal expansion coefficients between the chip and the substrate gives rise to a relative displacement of the connectors 3 and 7, which then no longer face one another (the bump then being oblique).

Finally, FIG. 1C shows the hybridization bump in the case where the temperature is raised to +120° C., which also leads to a shift in the relative position of the connectors 3 and 7, but in the direction opposite to that of FIG. 1B.

On considering FIGS. 1A, 1B and 1C it is easy to see that when the expansion coefficient of the chip differs from that of the substrate, the hybridization bump is deformed (cf. FIGS. 1B and 1C) in order to accommodate the expansion or contraction during the temperature change. As shown in FIGS. 1B and 1C, non-alignment of the connector 7 of the substrate 5 with the connector 3 of the chip 1 leads to a non-vertical shape of the bump 9.

In order to limit the expansion or contraction problem due to the differences of the expansion coefficients between the chip I and the substrate 5, an attempt has been made to fill the space between the chip 1 and the substrate 5 so that the material filling said space can absorb part of the stresses. The material used for filling the space between the chip and substrate is called the encapsulating substance. The obtaining of this total filling by an encapsulating substance consists, following the hybridization of the chip by bumps on the substrate, of filling the space between the chip and substrate using a dispenser. This requires a certain number of stages and relatively costly means.

In parallel, every increasing use is being made of the flip-chip method for hybrid sensor-type components. Thus, for such components, transfer generally takes place by bumps of a sensitive cell to an electronic control circuit more particularly produced on silicon using a conventional procedure. In this case, the sensitive cells are individually deposited on the electronic circuit, are collectively hybridized and each sensor is then cut. For such a construction, it is important to protect the sensitive structures against external attacks such as through the cutting, fitting or as a result of atmospheric conditions.

In order to protect the sensitive structures, as described hereinbefore, it is possible to insulate the interior of the assembly, i.e. the sensor with respect to the outside world. For this purpose it is possible to use an encapsulating substance in the form of a ring placed on the periphery of the chip. For this purpose IBM has studied the geometrical aspect of peripheral encapsulation in order to permit insulation in the manner described hereinbefore. The article entitled "Encapsulating flip-chip device with epoxy-resin" published in "International Interconnection Intelligence Flip-Chip Technology Impact Report" describes this geometrical aspect of encapsulation.

Other documents also describe different peripheral encapsulation types. U.S. Pat. No. 3,657,610 describes a semiconductor device having a metallic material sealing ring placed between two structures by applying ultrasonic vibrations at 300° C. EP-A-522 461 and U.S. Pat. No. 3,591,839 describe semiconductor devices sealing rings produced from several layers of metallic materials.

Like the total encapsulation described hereinbefore for ensuring the mechanical strength of the chip-substrate assembly, the formation of said peripheral encapsulation for sealing the assembly requires numerous stages and costly equipment. In addition, an annealing stage is generally necessary for the polymerization of the ring of bead normally produced using an epoxy resin adhesive, whereby said stage can be critical for the bumps or chip.

DESCRIPTION OF THE INVENTION

The present invention aims at obviating the disadvantages referred to hereinbefore. To this end it proposes a process for producing a ring ensuring the sealing of the chip hybridized by bumps on the substrate, whilst improving the mechanical resistance to temperature variations of the assembly constituted by the chip, the substrate and the hybridization bumps, particularly when the substrate is made from a material other than silicon.

For reasons of simplicity, said mechanical strength and sealing ring is referred to as the second material ring or even ring.

More specifically, the invention relates to a process for producing a sealing and mechanical strength ring between an interconnection substrate and an electronic component hybridized by bumps on said substrate.

This process is characterized in that it consists, parallel to the production of the hybridization bumps on a lower face of the electronic component or substrate by a first meltable material:

(a) depositing on the interconnection substrate or on the lower face of the electronic component a ring of a second meltable material, (b) placing the lower face of the electronic component on the interconnection substrate so as to obtain the connections between said electronic component and said interconnection substrate by means of the first meltable material; and (c) heating the thus formed assembly to a temperature at least equal to the highest melting point of said first and second meltable materials, in order to obtain hybridization bumps of height (h) by means of the first material and the sealing and mechanical strength ring by means of the second material, said ring having a height (h) and a width (d) in accordance with the following equations:

$$h > 10^{-2} D + \alpha$$

$$d > \frac{10^{-2} \times h}{h - \alpha}$$

in which $\alpha$ is a shape coefficient factor and D the largest dimension of the electronic component.

Advantageously, the second material has an expansion coefficient close to the expansion coefficient of the first material used for producing the hybridization bumps.

Advantageously, prior to stage (b), the ring is shaped by heating to a temperature at least equal to the melting point of the second material.

According to an embodiment of the invention, the second material is a meltable material identical to the first material used for producing hybridization bumps.

Advantageously, the second material is placed on the periphery of the space formed between the electronic component and the interconnection substrate.

According to a preferred embodiment of the invention, stage (a) consists of depositing the second material ring in preshaped manner on the interconnection substrate or on the lower face of the electronic component.

The attachment on the substrate and the electronic component of the second meltable material is obtained via an attachment material deposited on the substrate and on the electronic component.

BRIEF DESCRIPTION OF THE DRAWINGS

FIGS. 1A, 1B and 1C, already described, in each case show in a front view a bump of an electronic component mounted on a substrate made from a material whose expansion coefficient differs from that of the electronic component and whereof the ambient temperature is respectively +20, −50 and +120° C.

FIG. 2 shows in a sectional view a chip hybridized by bumps on an interconnection substrate and a sealing and mechanical strength ring (or second material ring) fitted between the chip and the substrate.

DETAILED DESCRIPTION OF EMBODIMENTS

Figure 3A:
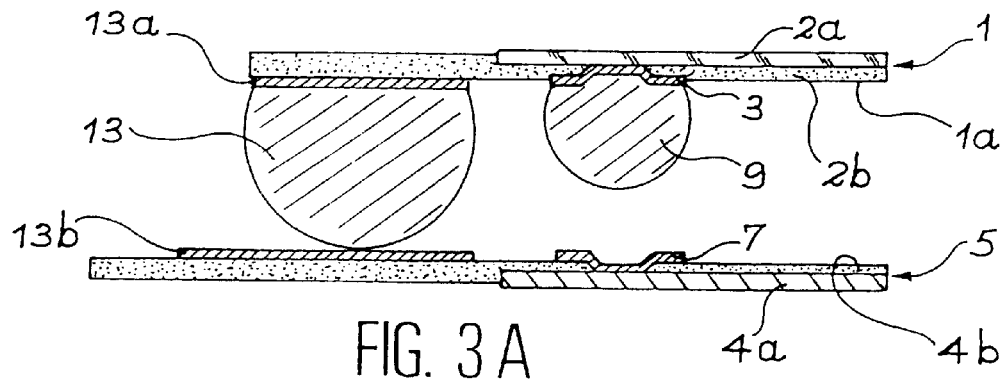
FIG. 3A shows a stage in the production of the ring in the case where the latter is deposited on the lower face of the chip.

FIG. 2 is a sectional view showing the substrate 5 on which is deposited the chip 1. The substrate 5 is shown in continuous line form, whereas chip 1 is shown in FIG. 2 in a mixed line form. Thus, FIG. 2 shows the connectors 3 of the chip. On the substrate 5, the connectors 6 of the interconnection substrate 5 are electrically connected to the connectors 7 (not shown of the substrate 5 by means of links 12. Moreover, the connectors 7 of the interconnection substrate are connected to the connectors 3 of the chip 1 by means of hybridization bumps. Thus, these hybridization bumps 9 in FIG. 2 are made from a meltable, conductive material. Therefore an electrical connection can be formed between the connectors 6 of the substrate 5 and the connectors 3 of the chip 1, via the connectors 7, the hybridization bumps 9 and the connecting wires 12. In FIG. 2 is also shown the ring 13, which is also referred to as the sealing and mechanical strength ring and which is made from a meltable material.

Preferably, the process of the invention uses the technological stages of producing the hybridization bumps on the chip 1 or the substrate for producing, during said stages, the ring 13 on the substrate 5 or on the lower face 1a of the chip 1 (lower face 1a of chip 1 being understood to mean the face facing the substrate 5).

According to the preferred embodiment of the invention, the ring 13 is made from a meltable material identical to that used for producing the hybridization bumps 9. This material can e.g. be indium or tin-lead alloy. More generally, said material can be any random type of meltable material generally used for the production of hybridization bumps.

Therefore this process has the advantage of permitting the production of the ring 13 during the production of the hybridization bumps 9. Thereafter, a not inconsiderable time gain is obtained, as well as an equipment gain, because it is no longer necessary to use an adhesive dispenser for producing the ring 13 following the stage of hybridizing the bumps 9.

In the remainder of the description, the process according to the invention will be described in its most complex embodiment, where the bumps 9 and ring 13 are produced from different meltable materials and in the particular case where the bumps are produced on the chip (it being obvious that they can also be produced on the substrate).

The meltable materials making it possible to respectively produce the ring 13 and the hybridization bumps 9 are deposited on the lower face 1a of the chip 1 and/or on the substrate 5, the assembly of said materials being raised to a heating temperature. In the case where the meltable material used for producing the ring 13 is different from that used for producing the hybridization bumps 9, the temperature to which the meltable materials is raised is at least equal to the melting point of the meltable material requiring the higher melting point. When, in the preferred embodiment of the invention, the meltable material used for producing the ring 13 is the same as the meltable material used for the hybridization bumps 9, the heating temperature is at least equal to the melting point of said meltable material.

This process consequently has the advantage of only permitting a single heating cycle for soldering both the hybridization bumps 9 and ring 13. In addition, the assembly formed by the substrate 5 and the chip 1 is perfectly encapsulated and therefore perfectly tight.

Figure 4:
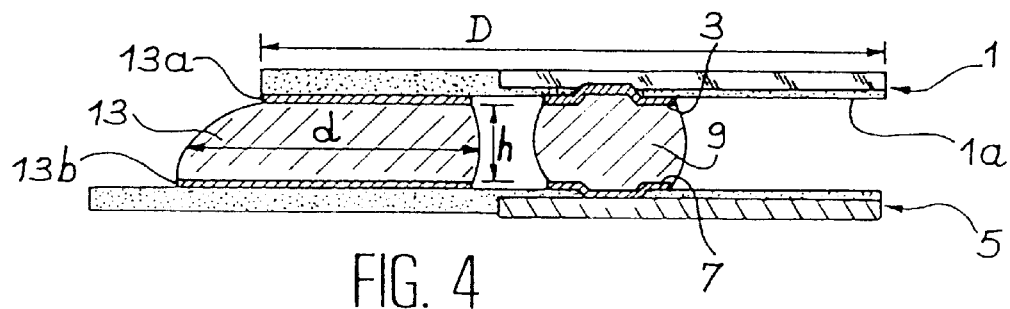
FIG. 4 shows the stage following the stages shown in FIGS. 3A to 3C of the production process according to the invention and in which the chip is placed on the substrate, the ring then serving as a mechanical strength and sealing joint between the chip and the substrate.

Advantageously, following the final heating stage, the ring 13 has a height h and a width d of a maximum nature in accordance with the following equations:

$$h > 10^{-2}D + \alpha$$

$$d > \frac{10^{-2} \times h}{h - \alpha}$$

in which $\alpha$ is a shape coefficient factor between 0 and 10, D is, according to the shape of the electronic component, either the diameter, or the largest dimension of the component, d is the ring width in the substrate plane and h is the ring height and also the height of the bumps after assembly, the ring and bumps then approximately having the same height. For a better understanding, these dimensions h, d and D are shown in FIG. 4 the ratio h/d representing the shape factor. These parametered D,D and h are preferably expressed in EM, the coefficient $\alpha$ being expressed in the same unit as h, D and d.

When these equations are proved, it is said that the shape factor of the ring 13 is adapted to the substrate-chip assembly. Therefore the ring 13 can ensure both the sealing and the mechanical strength of the assembly without any risk of local breaking, even in the particularly difficult cases where the size of the chip 1 is relatively large and where the substrate is made from alumina.

For example, a ring according to the invention can have a height h of 10 $\mu$M and a width d of 40 $\mu$m (for a component of width D=2mm), or a height h and a width d of 55 $\mu$m (for D=55 mm), or a height h and a width d of 105 $\mu$m (for D=10 mm), or a height h and a width d of 155 $\mu$m (for D=15 mm).

Figure 3B:
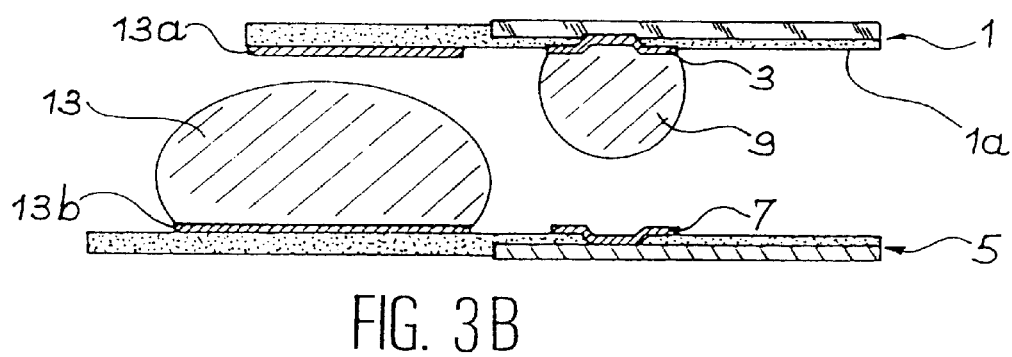
FIG. 3B shows the same stage of the process as FIG. 3A, but in the case where the ring is deposited on the substrate.
Figure 3C:
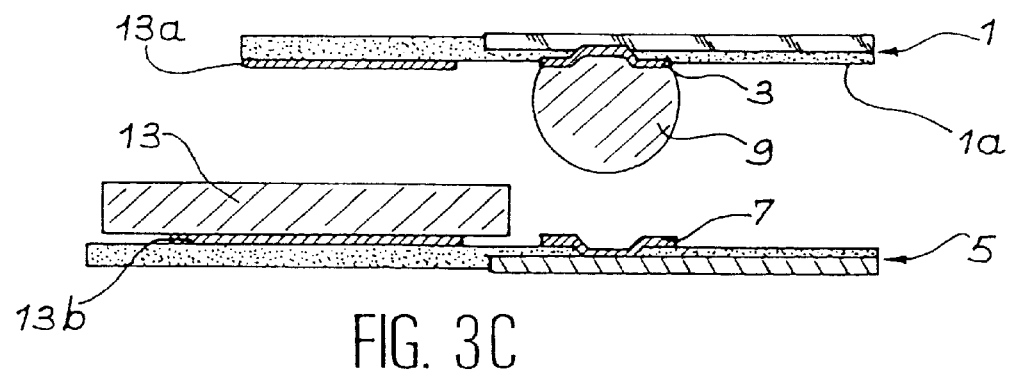
FIG. 3C also show the same stage of the implementation of the process according to the invention, but in the case where the ring has been preshaped prior to deposition on the interconnection substrate.

FIGS. 3A, 3B and 3C show in front view three different embodiments of the cord 13.

FIG. 3A illustrates the embodiment in which a meltable material is deposited on the lower face 1a of the chip 1. On said face 1a of chip 1a layer 13a of conductive material adapted to the meltable material has been deposited during the production of the connector 3 of the chip 1. In the same way, a conductive material layer 13b has been deposited on the substrate 5 during the production of the connector 7. The materials 13a and 13b are constituted by a conductive material having an adequate wettability for ensuring the attachment or adhesion of the meltable material 13. The conductive material can be gold in the case of an indium ring. During the deposition of the meltable material for producing the hybridization bump 9, there is also a deposition of meltable material for producing the ring 13 on said same face 1a of the chip 1. The chip 1 having the meltable material for producing the ring 13 and the meltable material for producing the bumps 9 is then advantageously raised to a chosen shaping temperature, which is at last equal to the highest melting point of the two meltable materials. It can be below the soldering temperature of the said materials used during assembly. This heat treatment makes it possible to recentre the meltable materials 13, 9 on their attachment materials, respectively 13a and 3. The chip 1 is then deposited on the substrate 5, the face 1a of the chip 1 then facing the surface of the substrate 5 carrying the connectors 13b and 7. When the chip 1 is deposited in this way on the substrate 5, the assembly is again raised to a heating temperature so as to ensure the soldering and assembly of the meltable materials with the corresponding connectors of the substrate. The levelling of the, bumps and the ring during assembly takes place by acting, prior to their production, on the attachment surfaces, respectively of the bumps 3 and 7 and the ring 13a and 13b. The latter meltable material soldering or brazing stage is illustrated in FIG. 4 and will be described in greater detail hereinafter.

This embodiment has the main advantage of permitting the production of the ring 13 and the bump 9 on the same support. This embodiment can essentially be used for bumps, whose height is e.g. below 55 $\mu$m after assembly because, in this case, the surface of the chip used for producing the ring remains small.

FIG. 3B shows a second embodiment of the invention, in which the meltable material used for producing the ring 13 is deposited on the substrate 5. As in FIG. 3A, the chip 1 and the substrate 5 respectively have conductive, attachment areas 13a, 13b. In this embodiment, one of the meltable materials is deposited on the lower face 1a of the chip for producing hybridization bumps 9. The second meltable material is deposited on the area 13b of the substrate 5 for producing the ring 13. When the meltable materials have been deposited respectively on face 1a of chip 1 and on substrate 5, the substrate on the one hand and the chip) on the other are advantageously raised to a shaping temperature in order to ensure, as in FIG. 3a, the recentering of the bumps and the ring on their respective attachment materials 3 and 13b. The respective shaping temperatures of the bumps and the ring are at least equal to the melting points thereof. The chip 1 is then deposited on the substrate 5, its lower face 1a facing the surface of the substrate 5. This assembly is then heated, as previously, to obtain the soldering of the bumps and the ring. The levelling of the bumps and the ring also takes place in the manner described hereinbefore.

This embodiment of the process according to the invention makes it possible to produce a ring for chips, whose hybridization bumps have a height of e.g. approximately 50 to 120 µm, the surface necessary for producing the ring being taken on the substrate.

FIG. 3C shows the embodiment of the process of the invention in which the meltable material of the ring has been transferred to the substrate in the form of a preform. More precisely, it is possible to see in FIG. 3C the chip 1 having conductive areas 3 and 13a, as well as the meltable material producing the hybridization bump 9. FIG. 3C also shows the substrate 5 with the conductive areas 7 and 13b. It is also possible to see the meltable material for producing the ring 13 in its preform. Thus, according to this embodiment, the meltable material has undergone preshaping, such as cutting or stamping in a meltable material sheet. This preformed meltable material 13 is then deposited on the substrate 5. Independently, the meltable material for producing the hybridization bump 9 is deposited on the face 1a of chip 1. This chip 1 is then raised to the chosen shaping temperature, which at least corresponds to the melting point of the meltable material for producing the bump. During the assembly stage, the chip 1 is deposited on the substrate 5, with its face 1a facing the surface of the substrate 5 provided with the ring 13. Finally, the assembly constituted by the chip 1, the substrate 5 and the meltable materials is raised to a chosen temperature for ensuring the soldering of said materials with the corresponding connectors.

The latter embodiment of the process according to the invention clearly requires a supplementary, calibrated, preshaping stage for the meltable material prior to producing the ring 13. However, it permits the production of a ring for bump-hybridized chips e.g. having a size between 100 and 300 µm. It also easily permits the obtaining of the desired shape factor.

FIG. 4 shows the chip 1 with its connector 3 and the conductive part 13a on which rests the ring 13a. FIG. 4 also shows the substrate 5 with the connector 7 and the conductive part 13b in contact with the ring 13. FIG. 4 shows the stage in which, the chip 1 having been deposited on the substrate 5, the chip-meltable material-substrate assembly is heated to ensure the melting of the meltable materials on the attachment materials, so that the parts 13a, 13b, 3 and 7 made from conductive material on the chip 1 and the substrate 5 are linked by the bump 9 and the ring 13.

FIG. 4 also shows the dimensions h, d and D referred to hereinbefore and which are respectively the height of the ring 13 and the bump 9, the width of the ring 13 and the largest dimension of the chip 1.

This process according to the invention consequently makes it possible to obtain a bead permitting on the one hand the sealing of the chip-substrate assembly and on the other improves the mechanical strength of said chip-substrate assembly, particularly in the case of temperature variations, in the case of hybridization bumps of different sizes, e.g. ranging from a few µm to 300 µm. Moreover, this process lends itself particularly well to collective production during several chips can be simultaneously hybridized during the same heating stage, the sealing and mechanical strength of each chip on the substrate being ensured by the ring associated therewith.

What is claimed is:

1. In a process for attaching an electronic component hybridized by bumps to an interconnection substrate by means of a first meltable material, the improvement which comprises, contemporaneously with the production of the hybridization bumps on a lower face of the electronic component or substrate by said first meltable material, forming a sealing and mechanical strength ring by:

(a) depositing on the interconnection substrate or on the lower face of the electronic component a ring of a second meltable material (b) placing the lower face of the electronic component on the interconnection substrate so as to produce connections between said electronic component and said interconnection substrate by means of the first meltable material and (c) heating the thus formed assembly to a temperature at least equal to the highest melting point of said first and second meltable materials, in order simultaneously to produce (i) hybridization bumps of height (h) of said first material, and (ii) the sealing and mechanical strength ring of the second material, said ring having a height (h) in µm, according to the equation:

$$h > 10^{-2}D + \alpha$$

wherein α is a shape coefficient factor and D is a dimension equal to the largest dimension of said electronic component.

2. In a process according to claim 1, the improvement wherein the sealing and mechanical strength ring has a height (h) and a width (d) according to the formulas:

$$h > 10^{-2}D + \alpha$$

$$d > \frac{10^{-2}D \times h}{h - \alpha}.$$

3. In a process according to claim 1, the improvement wherein the second material has an expansion coefficient substantially equal to the expansion coefficient of the first material.

4. In a process according to claim 1, the improvement wherein prior to stage (b), the ring is shaped by heating to a temperature at least equal to the melting point of the second material.

5. In a process according to claim 1, the improvement wherein the second material and the first meltable material are identical.

6. In a process according to claim 1, the improvement wherein the second material ring is placed adjacent the periphery of the space between the electronic component and the interconnection substrate.

7. In a process according to claim 1, the improvement wherein stage (a) consists of depositing a preshaped ring of said second material on the interconnection substrate or on the lower face of the electronic component.

8. In a process according to claim 1, the improvement wherein the shape coefficient factor (α) is between 0 and 10.

9. In a process according to claim 1, the improvement which comprises depositing an attachment material on the substrate and on the electronic component before depositing said second meltable material.

* * * * *